United States Patent [19]

Ng

[11] Patent Number: 4,965,739
[45] Date of Patent: Oct. 23, 1990

[54] MACHINE PROCESS FOR ROUTING INTERCONNECTIONS FROM ONE MODULE TO ANOTHER MODULE AND FOR POSITIONING SAID TWO MODULES AFTER SAID MODULES ARE INTERCONNECTED

[75] Inventor: Charles H. Ng, Sunnyvale, Calif.

[73] Assignee: VLSI Technology, Inc., San Jose, Calif.

[21] Appl. No.: 390,420

[22] Filed: Aug. 7, 1989

Related U.S. Application Data

[63] Continuation of Ser. No. 31,081, Mar. 26, 1987, abandoned.

[51] Int. Cl.$^5$ .......................................... G06F 15/60
[52] U.S. Cl. .................................. 364/491; 364/488; 364/489; 364/490
[58] Field of Search ................ 364/488, 489, 490, 491

[56] References Cited

U.S. PATENT DOCUMENTS

| | | | |
|---|---|---|---|
| 3,567,914 | 3/1971 | Neese | 364/489 |
| 3,681,782 | 8/1972 | Scanlon | 364/491 |
| 3,702,004 | 10/1972 | Eskew et al. | 364/489 |
| 4,484,292 | 11/1984 | Hong et al. | 364/491 |
| 4,541,114 | 9/1985 | Rutenbar et al. | 364/491 |
| 4,564,773 | 1/1986 | Tanizawa et al. | 364/491 |
| 4,577,276 | 3/1986 | Dunlop et al. | 364/491 |
| 4,593,362 | 6/1986 | Bergeron et al. | 364/488 |
| 4,593,363 | 6/1986 | Burstein et al. | 364/491 |
| 4,613,941 | 9/1986 | Smith et al. | 364/490 |
| 4,636,965 | 1/1987 | Smith et al. | 364/491 |

OTHER PUBLICATIONS

Rabbie et al; "Gridless Channel Routing and Compaction for Cell-Based Custom IC Layout"; Custom Integrated Circuits Conference, IEEE 1986; pp. 297-299.

Primary Examiner—Bruce Y. Arnold
Assistant Examiner—Terry S. Callaghan
Attorney, Agent, or Firm—Limbach, Limbach & Sutton

[57] ABSTRACT

In the present disclosure, a method of routing interconnections between a semiconductor module and another semiconductor module in a planar field by the use of a digital computer program is disclosed. The method is a variation of the prior art YACR method. The method provides for variable width track routing, as well as cost equation for net assignment and cost equation of net chosen to particular a horizontal track. The present invention also relates to a method for positioning the modules. The method of positioning the two modules or compacting the modules is a method for moving tracks between modules from one module to the other module as close to the opposite module as possible within the design rule constraints. The tracks are then moved in an opposite direction and the straightest segment to minimize jogs is chosen. Each track is then moved in the opposite direction and is moved as close to the straightest previous adjacent track as possible, within the design rule constraint.

9 Claims, 3 Drawing Sheets

MACHINE PROCESS FOR ROUTING INTERCONNECTIONS FROM ONE MODULE TO ANOTHER MODULE AND FOR POSITIONING SAID TWO MODULES AFTER SAID MODULES ARE INTERCONNECTED

This is a continuation of Ser. No. 031,081, filed 3/26/87, now abandoned.

This application is submitted with a microfiche Appendix (Exhibits B and C), consisting of three microfiches and 182 frames.

TECHNICAL FIELD

The present invention relates to a machine process by the use of a program digital computer having stored therein a computer program for routing interconnections from one module to another module on a planar field and, more particularly, where said interconnections are electrical wires. The present invention also relates to a machine process for positioning said two modules compactly on the planar field after the modules are interconnected.

BACKGROUND OF THE INVENTION

In the field of computer-aided design, it is known to use a digital computer having a program stored therein for routing interconnections between one module and another module on a planar field. In addition, it is also known to use a digital computer having a program stored therein for compacting the position of the modules after they are interconnected or routed. Typically, the modules are semiconductor integrated circuits and the interconnections are electrical wires. An example of a prior art technique to perform the routing of interconnections between modules and/or the positioning of modules after they have been routed, by the use of a digital computer having a program stored therein, is disclosed in U.S. Pat. No. 3,681,782. That reference teaches a machine process for positioning interconnected components to minimize interconnecting line length. See also "Gridless Channel Routing and Compaction for Cell Based Custom IC Layout" by Harold Rabbie and Jacob Jacobsson, IEEE 1986 Custom Integrated Circuits Conference, page 297, published on May 12, 1986. In addition, see "A New Gridless Channel Router: Yet Another Channel Router II (YACR-II)" by A. Sangiovanni-Vincentelli, M. Santomauro and Jim Reid, PROC. International Conference On Computer-Aided Design 84, pages 72-75, 1984; and "An Industrial World Channel Router For Non-Rectangular Channels" by C. H. Ng, PRO. 23rd Third Design Automation Conference, pages 490-494, 1986 (hereinafter the latter two references are referred collectively as: "YACR").

Of all the known prior art relating to a machine process for routing interconnections between two modules, the most relevant reference of which the applicant is aware is the YACR reference. The invention set forth herein is an improvement to the basic YACR method.

Of all the known prior art relating to a machine process for positioning the modules on a planar field by the use of a programmed digital computer, the most relevant reference of which the applicant is aware is the article by Rabbi and Jacobsson. In Rabbi and Jacobsson, compaction is done by moving tracks against a contour in one direction only. However, applicant believes that he had conceived of the invention prior to the publication date of the Rabbi and Jacobsson reference, and had worked diligently to reduce the invention, which occurred after the publication date. The present invention is also an improvement to that method.

SUMMARY OF THE INVENTION

In the present invention, a machine process for routing interconnections from one module to another module on a planar field by the use of a programmed digital computer is disclosed. The method of routing includes the steps of establishing columns from one module to the other module, tracing the beginning column of one net to the end column of that net for all nets where each net is a symbolic representation for an interconnection. The density of the tracks in each column is calculated. The improvement comprises calculating the net assignment for each net based upon a first-cost equation. The net with the highest cost calculated from the first-cost equation is assigned to a track in accordance with a second-cost equation. The net is routed to an available track with the lowest cost. The steps are repeated for all the other nets in accordance with decreasing cost based upon the first-cost equation. Thereafter, the ends of the track for each net is connected to the respective columns for that net.

The present invention also comprises a machine process for positioning two modules on a planar field by the use of a digital computer having a stored computer program after the modules have been interconnected. The two modules are separated by region defined by a plurality of substantially parallel columns from one module to the other module and by a plurality of substantially parallel tracks, each of which is substantially perpendicular to the columns. A portion of each of the interconnection lies on a column and on a track. The program enables the computer to perform the steps of moving a track which is closest to one of the modules to that one module by moving each point in the track intersected by a column to as close to the one module as possible, such that the track that is moved has a first profile. A guard frame is established for the track just moved. The steps are repeated for each succeeding track which is the next furthest away from the last track moved in the direction of the other module. Once all the tracks have been moved, the other module is also moved in a direction towards the one module to as close to the last track moved as possible.

DETAILED DESCRIPTION OF THE DRAWINGS

Figure 1:
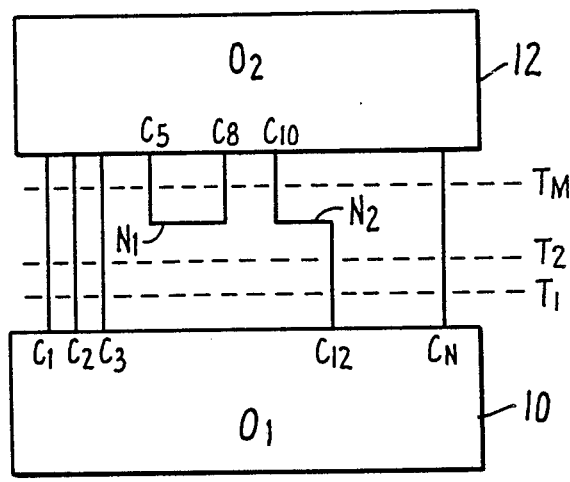
Referring to FIG. 1, there is shown a schematic diagram in block form of a step in the method of routing interconnections from one module to another module on a planar field by the use of a programmed digital computer using a prior art program.

Referring to FIG. 1, there is shown a block diagram of a first object $O_1$, 10 and a second object $O_2$, 12. The objects 10 and 12 are typically modules on a planar field and are typically symbolic representations of semiconductor integrated circuits As such, wires to interconnect the objects 10 and 12 must be routed from pins in one module 10 to pins in the other module 12.

As previously described, in the method of the prior art, known as YACR, the method of routing interconnections from pins in one module 10 to pins in another module 12 on a planar field is accomplished by the use of programmed digital computer having stored therein a computer program. In the YACR method, one begins with rectangularly shaped modules. Further, a plurality of columns, $C_1 \ldots C_n$, are established from one module 10 to the other module 12. The columns $C_1 \ldots C_n$ are generally vertical and are established evenly spaced apart from one another and are directed to locations where electrical pins of the modules are. The columns must thus be spaced apart by at least the distance of a routing pitch. In addition, a plurality of parallel tracks, $T_1 \ldots T_m$, are established. The tracks $T_1 \ldots T_m$ lie between the modules 10 and 12, are generally horizontal, and intersect the vertical columns, $C_1 \ldots C_n$, and being substantially perpendicular thereto. In the YACR method, nets are first defined. A net is a symbolic representation of the tracing of a wire from a pin in one module 10 to another pin. The other pin can be in the same module 10 or can be in the other module 12. The beginning column of each net to the end column of that net is traced for all nets. Thereafter, the density of horizontal tracks in each column is calculated. The calculation is simply the number of horizontal tracks in each column crossed by that vertical column caused by the tracing of the nets.

Thus, in FIG. 1, the first net $N_1$ defines the interconnection from $C_5$ to $C_8$ and the second net $N_2$ defines the interconnection from $C_{10}$ to $C_{12}$. The density of Columns $C_5$ to $C_8$ and $C_{10}$ to $C_{12}$ would all be one track, that being the number of tracks lying in each of those columns.

Because the vertical columns are evenly spaced apart, the YACR method can route only nets with fixed width. Further, as previously stated, the pins must be located on the columns, thereby restricting the location of the pins to fixed positions.

Figure 2:
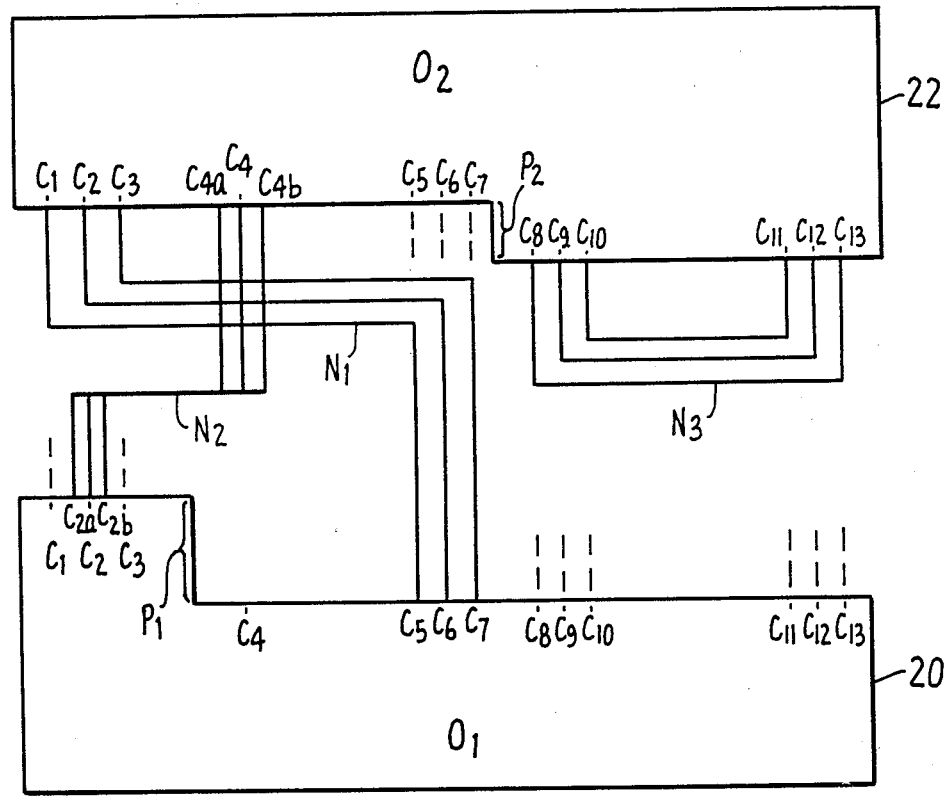
FIG. 2 is a schematic block diagram of a step in the method of routing interconnections from one module to another module of the present invention.

Referring to FIG. 2, there is a symbolic representation of the modules 20 and 22 used in the method of the present invention. In contrast to the YACR method, the modules 20 and 22 need not be rectangularly shaped. Thus, in FIG. 2, first module 20 is shown with a rectangularly shaped appendage having a length $P_1$ attached to the first module 20. Similarly, the second module 22 is not rectangularly shaped.

In the method of routing interconnections from one module 20 to the other module 22 of the present invention, columns are first established for each of the modules 20 and 22, extending generally vertically from one module to the other module. However, unlike the YACR method of the prior art, the vertical columns are not placed evenly spaced apart. Instead, since each pin to a module may have a variable width, a vertical column is established along the center point of each pin, as well as the two endpoints of each pin. The vertical columns are then extended to the other module. Thus, in FIG. 2, a pin having a width defined as the difference in position between $C_3$ and $C_1$ is in the other module 22. The vertical columns $C_1$, $C_2$ and $C_3$ extend from the other module 22 to the one module 20. If a pin had only a single track width, as shown in the first module 20 in the column $C_2$, a single horizontal line then extends between the one module 20 and the other module 22. However, a plurality of vertical lines still extend from one module 20 and the other module 22 to the horizontal track. Further, since the columns can be in any location, the pins can also be at any location so long as the spacing between the pins follow the constraint of the method to make the modules. To those skilled in the art, this is termed routing of "girdless" pins.

Similar to the YACR method, nets are established and the beginning column of one net to the end column of that net is traced for all nets. Each net is the symbolic representation of each interconnection. Thus, in FIG. 2, a first net, $N_1$ is the interconnection from the other module 22 at the location of $C_1$-$C_2$-$C_3$ to a pin defined in the one module 20 having a location of $C_5$-$C_6$-$C_7$. A second net, $N_2$, is from the pin $C_2$ in the one module 20 extending to column $C_4$ in the other module 22. A third net, $N_3$, is defined by the columns $C_8$-$C_9$-$C_{10}$ of the other module 22 extending to the column $C_{11}$-$C_{12}$-$C_{13}$ of the other module 22.

Thereafter, the density of each column is calculated. The density is calculated by adding the track widths of all the nets that cross each column. Thus, in FIG. 2, the density calculation for each column is as follows:

Density of $C_1$ = Track width of net 1
Density of $C_2$ = Track width of net 1 + Track width of net 2
Density of $C_3$ = Track width of net 1
Density of $C_4$ = Track width of net 1 + Track width of net 2
Density of $C_5$ = Track width of net 1
Density of $C_6$ = Track width of net 1
Density of $C_7$ = Track width of net 1
Density of $C_8$ = Track width of net 3
Density of $C_9$ = Track width of net 3
Density of $C_{10}$ = Track width of net 3
Density of $C_{11}$ = Track width of net 3
Density of $C_{12}$ = Track width of net 3
Density of $C_{13}$ = Track width of net 3

If the modules 20 and 22 are not rectangularly shaped, as in the case in the example shown in FIG. 2, then all offsets are added to each vertical column density due to the geometry of the offset. Thus, the density of column $C_1$, $C_2$, and $C_3$ are all added by the amount $P_1$. Similarly, the density of $C_8$, $C_9$, $C_{10}$, $C_{11}$, $C_{12}$ and $C_{13}$ are also added by the length $P_2$.

Preferably, the routing of columns in a vertical direction is done in one layer, typically a first metallization layer or $M_1$. Routing of interconnections in a horizontal direction is done in a second layer, typically the second metallization layer or the $M_2$ layer. If a pin however, is in the second layer or $M_2$ and is desired to route the net from that pin in a vertical direction, i.e., in the first layer $M_1$, clearly, it is first necessary to route the pin to a via hole, which is an interlayer connection connecting $M_2$ to $M_1$ and then route that in layer $M_1$. The via hole contributes to the density. Therefore, the number of tracks occupied by the width of a via hole must be added to the density for the density calculation.

A data structure is built by the computer program which allocates memory for each column.

Thereafter, a cost equation for net assignment is made. The cost equation is calculated in accordance with the program set forth as follows:

```
integer i, j, netno, theNet, densitySum, den res;
long integer maxCost, netCost;
pointer (prLocalNetClass) net;
pointer (prLocalPinClass) pin;
pointer (prColClass) col;
res := (routeDensity div 5) max 1; # resolution
for netno := 1 upto nets.listsize do begin
  net := at(nets, netno);
  if net.usedTracks.listsize > = routeDensity
  then return(false);
  densitySum := 0;
  for l := 1 upto net.pins.listsize de begin
    pin := at(net.pins, i);
    den := 0;
    for j := pin.lsColNo upto pin.rsColNo do begin
      col := at(columns, j);
      if (pin.flags tst pinOnTopp) then begin
      if col.bpin the den .max (density.buffer[j] div res);
      end else if pin.flags tst pinOnBot then begin
      if col.tpin then den .max (density.buffer[j] div res;
    end;
  end;
  densitySum .+ den;
end;
net.assignCost := cvli(net.usedTracks.listsize) * highCost
  + cvli (densitySum) * mediumCost
  + cvli (net.level + net>blevel);
end;
```

This first cost equation is well known in the art.

Once the calculation for cost is made, the program selects the net with the highest cost from the first cost equation. In contrast, in the YACR method, the vertical column with the highest density is first selected.

Once a net with the highest cost is selected, a second cost calculation is used to reflect the cost of assigning that net to a particular track. The assignment of a net to a track is done in accordance with the program set forth on Exhibit A, attached hereto. In general, a net can occupy a number of tracks because it is of variable width. In contrast, in the YACR method of the prior art, a net is always representative of one track width.

The program set forth on Exhibit A also constructs a vertically weighted constraint graph.

In the prior art YACR method, because each column is of unity width, if a plurality of interconnections cross a particular column, the constraint for that column is simply the number of tracks which cross the column.

In contrast, because the method of the present invention permits routing of interconnections with variable width, the constraint in each column must be "weighted" by the number of interconnections and the width of each interconnection which crosses that column.

The net is assigned to a horizontal track with the lowest cost based upon the second cost equation. The net assigned to that available horizontal track with the lowest cost is then routed.

The steps of calculating the net assignment and assigning the next highest cost net to a horizontal track is then performed and all other nets are then assigned to appropriate horizontal tracks. In contrast, in the YACR method, the selection of other columns is accomplished by proceeding to the right or to the left of the vertical column with the highest density, first selected. The vertical columns of each net are then connected to the horizontal track for that net routing.

A typical program to achieve the foregoing method is accomplished by the use of a program which has been executed on the Appollo DN660 computer. That program comprised of three modules: PRCHR2.MS, PRMAZ2.MS and PRWIRE.MS. A copy of that program is attached as Exhibit B.

Once the wire has been routed, it is desirable to move the modules 20 and 22 to as close together as possible. This is because in the semiconductor industry, it is desirable to have the integrated circuits produced on as small a scale as possible, thereby increasing the yield on any given size wafer.

Figure 3:
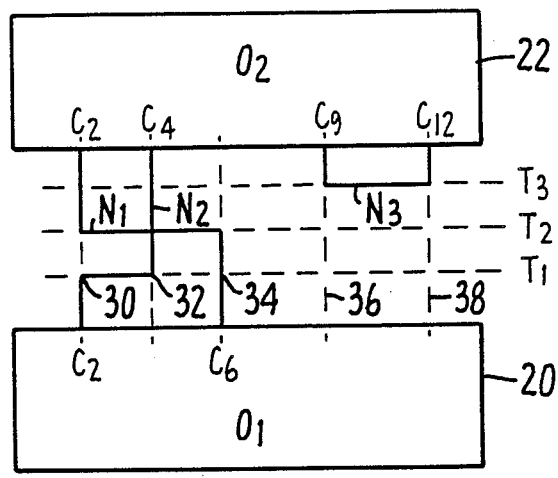
FIG. 3 is a schematic block diagram of a step in the method of the present invention for positioning two modules on a planar field.

Referring to FIG. 3, there is shown two semiconductor modules 20 and 22 routed in accordance with the method of the present invention. The interconnections are shown only as connecting the center point of each pin. The end points of the pins are not shown. In the method of compacting the modules or positioning the two modules, it is not necessary to know the end points of the routed wires. Thus, the method of compaction of the present invention can be used with modules routed with any prior art method.

The machine process for positioning the two modules is again accomplished by the use of a programmed digital computer having stored therein a computer program. The two modules 20 and 22 are separated by a region which is defined by a plurality of substantially parallel columns from one module to another module and by a plurality of substantially parallel tracks, each of which is substantially perpendicular to the columns. The modules 20 and 22 are interconnected by a plurality of interconnections. A portion of each of the interconnections lies on a column and on a track. In the example shown in FIG. 3, three tracks are shown having the designation of $T_1$, $T_2$ and $T_3$, respectively. There are five vertical columns having the same designation used in FIG. 2, namely, column $C_2$, $C_4$, $C_6$, $C_9$ and $C_{12}$. For simplicity of presentation, the modules are shown as rectangularly shaped. However, the method of compaction of the present invention can be practiced with non-rectangularly shaped modules.

Figure 4A:
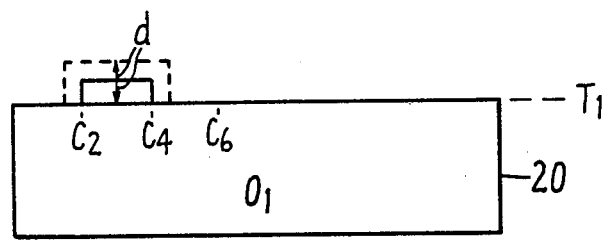
FIG. 4(a-f) are steps in the method of positioning two modules of the present invention.

Referring to FIG. 4a, there is shown a first step in the method of the present invention. One begins with one of the two modules. In this case, the first module 20 is chosen. Thereafter, the track closest to that first module 20, in this case track $T_1$, is moved. The track $T_1$ is moved by moving each point along that track which is intersected by a column to as close to the one module 20 as possible. Thus, in track $T_1$, there are five points which are intersected by the five columns. The five points define six segments of track $T_1$. A first segment is the region leftmost of module 20 extending to point 30. The second segment lies between the points 30 and 32. The third segment lies between the points 32 and 34. The fourth segment lies between the points 34 and 36. The fifth segment lies between the points 36 and 38. The final segment is the region from point 38 to the rightmost edge.

Since no interconnection or wire lies on the first segment, that portion of track $T_1$ may be moved all the way against the edge of the first module 20 or object $O_1$. The second segment, the line between points 30 and 32, has the wire for net 2 lying thereon. It can be moved as close to first module 20 as possible within the constraint of the design rule which permits the routing of that wire. In short, since the wire has a certain width and the process to make that wire has certain parameters regarding how close the next object can be to the boundaries of the wire width (called Design Rules), that wire can be moved as close to the object $O_1$ or first module 20 as possible without violating the design rules.

As for the third, fourth, fifth and sixth segments, since there are no wires lying on those segments, those can also be moved to as close to the object $O_1$ as possible—namely, abutting the edge of object $O_1$. Thus, the new profile for the track would have the shape shown in FIG. 4a in which track $T_1$ takes on a solid line. Between Columns $C_2$ and $C_4$, track $T_1$ is at a distance d from module 20. This is as close to module 20 as the track $T_1$ can be moved to module 20.

After the track $T_1$ is moved, a new guard frame is established for track $T_1$. The guard frame is the constraint by which other tracks can be moved as close to track $T_1$ as possible. The guard frame comes into effect in the second segment in which there is a segment of wire. The new guard frame for track $T_1$ is shown in FIG. 4a as a dotted line. The dotted line shows the closest position to track $T_1$ to which any object or track can be moved due to the wire in segment 2.

Figure 4B:
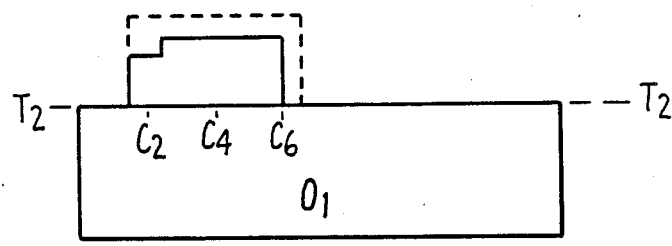
Figure 4C:
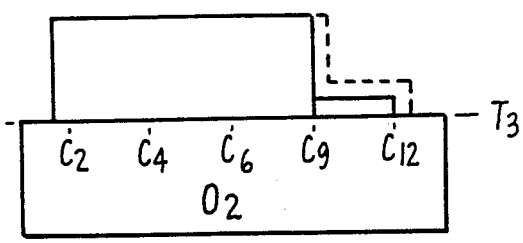
Figure 4D:
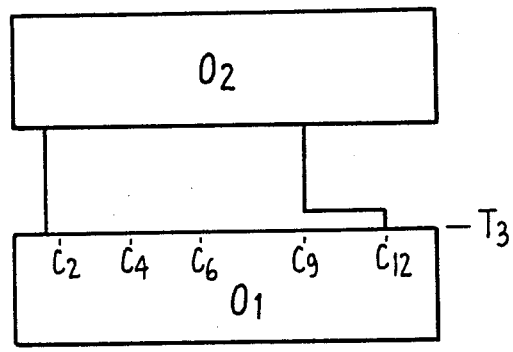

Referring to FIG. 4b and FIG. 4c, there is shown the similar operation in which track $T_2$ is then moved as close to track $T_1$ as possible by moving each point in the track intersected by a column. Track $T_2$ would then also have first profile. A new guard frame is then established for track $T_2$.

Similarly, track $T_3$ is moved as close to track $T_2$ as possible. In the same manner as tracks $T_1$ and $T_2$, a new guard frame will also be established for track $T_3$.

Once the last track furthest away from the first module 20 is moved, the other module 22 is then moved in the direction towards the first module 20 to as close to the last track moved as possible. Thus, object $O_2$ or module 22 is moved as close to track $T_3$ as possible. Track $T_3$ will acquire a first profile, $T_{3(1)}$.

Thereafter, track $T_3$, the last move track, is then moved in a direction away from the one module 20 and towards the other module 22. Track $T_3$ is moved as close to the other module 22 as possible. Each point intersected by a column in track $T_3$ is moved as close to the other module 22 as possible. Thus, track $T_3$ will acquire a second profile, $T_{3(2)}$.

Figure 4E:
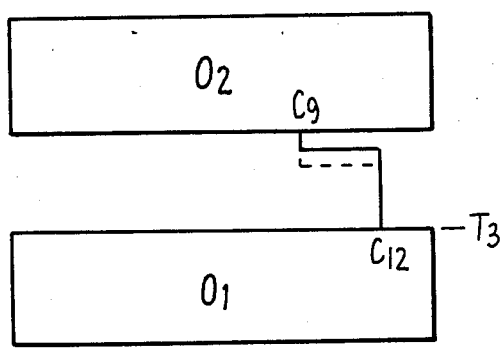
Figure 4F:
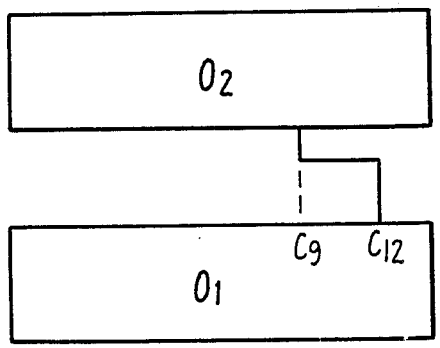

Between the first profile and the second profile for the track $T_3$, the straightest segment of the track moved that has an interconnection line thereon is selected. This is to choose a segment of wire which is as straight as possible with a minimum number of jogs therein. With that segment as straight as possible being selected, a guard frame is then established for that track. This becomes the final profile for track $T_3$. If the first profile and the second profile overlap such that the straightest segment of the track moved cannot be found between the two profiles, then the second profile for the track $T_3$ is deliberately moved away from other module 22 such that the two profiles will not overlap. Track $T_2$ is moved as close to the final profile for track $T_3$ as possible. A new guard frame for track $T_2$ is established. This step is repeated for track $T_1$ and is moved to track $T_2$ as close as possible. Finally, the one module 20 is moved as close to track $T_1$ as possible. This is graphically shown in FIGS. 4e and 4f.

Figure 5A:
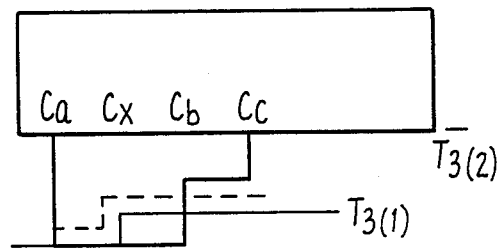
FIG. 5(a-b) are steps showing the positioning of a track to a final profile to minimize jogs in the interconnection.
Figure 5B:
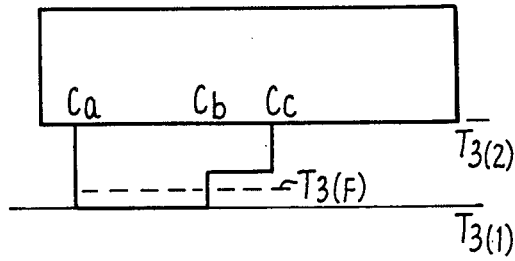

Referring to FIGS. 5a and 5b, there is shown the steps of moving track $T_{3(2)}$ and the selection of a final profile $T_{3(F)}$. In FIG. 5a, there is shown track $T_3$ with the first profile $T_{3(1)}$ and the second profile $T_{3(2)}$. The dotted line represents that portion of $T_3$ that has an interconnection lying thereon. The interconnection on track $T_{3(1)}$ between Columns $C_a$ and $C_c$ is not a straight line. There is a jog at $C_x$. In the method of compaction of the present invention, $T_{3(1)}$ is moved away from $T_{3(2)}$ by an amount sufficient to insure that the profiles $T_{3(2)}$ and $T_{3(1)}$ do not overlap in the area where there is an interconnection. The movement of $T_{3(1)}$ away from $T_{3(2)}$ is shown in FIG. 5b. The resultant profit $T_{3(F)}$ chosen is a straight line connection between $C_a$ and $C_c$. Compaction of position is sacrifice to decrease jogs, which can cause interconnection failures.

The method of the present invention for positioning the modules is performed for interconnections routed in each layer. Wires are compacted by first evaluating the first layer metal and then evaluating the second layer metal. Further, within each layer, the method of the present invention compacts first on the wire segments, then it operates on the vias. In this manner, the two separate steps permit the vias to slide away from the wire segments.

Similar to the method of the present invention for routing interconnection between one module to another module, the method of the present invention for positioning two modules is accomplished by a computer program running on the Apollo DN660 computer. A copy of that program is attached herewith as Exhibit C.

There are many advantages to the method of routing of the present invention. First and foremost, unlike the YACR method of the prior art, the method of routing of the present invention provides for routing of nets that have variable width. Furthermore, the assignment of nets to particular horizontal tracks is more efficient in that the assignment of nets to tracks is based upon a cost equation Here again, unlike the YACR prior art method, which merely chooses the net with the highest density track width first and then proceeds to the left or to the right of that column, the method of the present invention provides for choosing the net with the highest cost equation. Thereafter, the net with the highest cost equation is then assigned to the horizontal track with the lowest cost. This is the most efficient assignment of nets to tracks. This is because calculations for more dense nets are performed first. Further, those dense nets are assigned to lowest and most easily available horizontal tracks.

There are also many advantages to the method of the present invention for positioning the modules after they are routed. First and foremost is that the compaction provides for maximum efficiency. In addition, the method of positioning the modules can compact interconnections of variable width, as routed by the router of the present invention. Yet, the compaction also provides for choice of segments of tracks that have interconnections lying in as straight a segment as possible to reduce interconnection failures. The balance between maximum compaction and maximum performance is struck. Further, compaction is done in two directions and the track profile is altered to provide for minimization of jogs in the interconnections routed.

What is claimed is:

1. A machine process for positioning two modules on a planar field by the use of a programmed digital computer having stored therein a program, said program for creating representations of said modules in said computer, said representations are separated by a region defined by a plurality of substantially parallel columns from a representation of one module (hereinafter: "one representation") to a representation of the other module (hereinafter: "other representation") and by a plurality of substantially parallel tracks having variable widths substantially perpendicular to said columns, said representations of the modules are connected by a plurality of interconnections; a portion of each of said interconnection lies on a column and on a track, said program enabling the computer to perform the following steps:

(a) moving a track, having a first width closest to said one representation to said one representation by moving each point in said track, intersected by a column, to as close to said one representation as possible such that said track moved has a first profile;

(b) establishing a guard frame for said track moved in step (a);

(c) repeating the steps of (a) and (b) by moving the track next furthest away from the last track, having a second width different from said first width moved in the direction of said other representation; and (d) moving said other representation in a direction to said one representation to as close to the last track moved as possible;

wherein said modules are placed in positions of said representations.

2. The method of claim 1 further comprising the steps of:

(e) moving a track closest to said other representation to said other representation by moving each point in said track, intersected by a column, to as close to said other representation as possible, such that said track moved has a second profile;

(f) selecting the longest straight segment of said track moved that has an interconnection lying thereon, that lies between said first and second profiles;

(g) establishing a guard frame for said track moved in step (b);

(h) repeating the steps of (e), (f) and (g) by moving the track immediately adjacent to and away from the last track moved in the direction of said one representation and (i) moving said one representation in a direction to said other representation to as close to the last track moved as possible.

3. The method of claim 2 wherein step (f) further comprises the step of moving said track with said second profile away from said other module by an amount sufficient to establish the longest straight segment with an interconnection lying thereon between said first and second profiles.

4. An improved method of routing interconnections from one module to another module on a planar field by the use of a programmed digital computer having stored therein a program, said program for creating representations of said modules in said computer, said method of routing including the steps of establishing a plurality of substantially parallel columns from one representation of one module (hereinafter: "one representation") to the other representation of other module (hereinafter "other representation"); establishing a plurality of substantially parallel tracks wherein each track has a density and a variable width associated therewith, each track substantially perpendicular to a column; tracing the beginning column of one net to the end column of that net, for all nets, wherein each net is the symbolic representation of each interconnection; calculating the density of tracks in each column; wherein the improvement comprising:

(a) calculating a cost associated with the net assignment for each net to a column;

(b) assigning the net with the highest cost calculated from step (a) to a horizontal track;

(c) routing the net of step (b) to an available horizontal track with the lowest cost;

(d) repeating the steps of (b) and (c) for all other nets in accordance with decreasing cost calculated from step (a);

(e) connecting the columns of each net to the track of that net routed in accordance with step (c); and (f) routing interconnection from one module to another module in accordance with the routes calculated from the representations.

5. A method of routing interconnections from one pin in a module to another pin of another module on a planar field by the use of a programmed digital computer having stored therein a program, said program for creating representations of said modules in said computer, each of said interconnection for connecting said one pin having two end points and a center point to said other pin having two end pints and a center point; said method comprising the steps of establishing a plurality of columns from one representation to the other representation, wherein each column originates along the end points and the center point of each pin;

tracing from the beginning column of one net to the end column of that net, for all nets, wherein each net is the symbolic representation of each interconnection;

calculating the density of each column by adding the track width of all the nets crossing that column;

calculating a cost associated with the net assignment for each net;

assigning the net with the highest cost calculated to a horizontal track;

routing the net assigned to an available track with the lowest cost;

repeating the steps of calculating the net assignment and assigning the net to a track for all other nets in accordance with decreasing cost;

connecting the columns to the track of each net routed; and routing interconnection from one pin in module to another pin of another module in accordance with the routes calculated for the representations.

6. The method of claim 5, after calculating the density step and prior to the calculating the cost associated with each net step, further comprising the step of offsetting said density calculation by the amount of protrusion one representation has in relationship to said other representation in the direction to said other representation, and an amount for vias, if any, between said representations.

7. The method of claim 5 further comprising the steps of positioning said one representation with respect to said other representation after the interconnections are routed, wherein said representations are separated by a region defined by a plurality of substantially parallel columns from one representation to the other representation and by a plurality of substantially parallel tracks having variable widths substantially perpendicular to said columns, said representations are connected by a plurality of interconnections, a portion of each of said interconnection lying on a column and on a track, said method comprising the steps of:

(a) moving a track having a first width closest to said one representation to said one representation by moving each point in said track, intersected by a column, to as close to said one representation as possible, such that said track moved has a first profile;

(b) establishing a guard frame for said track moved in step (a);

(c) repeating the steps of (a) and (b) by moving the track immediately adjacent to and away from the last track moved in the direction of said other representation, said track moved having a second width different from said first width; and (d) moving said other representation in a direction to said one representation to as close to the last track moved as possible.

8. The method of claim 7 further comprising the steps of:

(e) moving a track closest to said other representation to said other representation by moving each point in said track, intersected by a column to as close to said other representation as possible, such that said track moved has a second profile;

(f) selecting the longest straight segment of said track moved that has an interconnection lying thereon, that lies between said first and second profiles;

(g) establishing a guard frame for said track moved in step (b);

(h) repeating the steps of (e), (f) and (g) by moving the track immediately adjacent to and away from the last track moved in the direction of said one representation; and (i) moving said one representation in a direction to said other representation to as close to the last track moved as possible.

9. The method of claim 8 wherein step (f) further comprises the step of:

moving said track with said second profile away from said other representation by an amount sufficient to establish the longest straight segment with an interconnection lying thereon between said first and said second profiles.

* * * * *